United States Patent
Hsieh et al.

(10) Patent No.: US 6,881,629 B2
(45) Date of Patent: Apr. 19, 2005

(54) METHOD TO MAKE MINIMAL SPACING BETWEEN FLOATING GATES IN SPLIT GATE FLASH

(75) Inventors: Chia-Ta Hsieh, Tainan (TW); Yi-Jiun Lin, Taipei (TW); Feng-Jia Shiu, Hsinchu (TW); Hung-Cheng Sung, Hsin-chu (TW); Chi-Hsin Lo, Chupei (TW)

(73) Assignee: Taiwan Semiconductor Manufacturing Company, Hsin-Chu (TW)

(*) Notice: Subject to any disclaimer, the term of this patent is extended or adjusted under 35 U.S.C. 154(b) by 0 days.

(21) Appl. No.: 10/655,662

(22) Filed: Sep. 5, 2003

(65) Prior Publication Data

US 2005/0054162 A1 Mar. 10, 2005

(51) Int. Cl.[7] .......................................... H01I 21/8247
(52) U.S. Cl. ..................................... 438/266; 438/593
(58) Field of Search ............................... 438/257–267, 438/593–594, 585

(56) References Cited

U.S. PATENT DOCUMENTS

| | | | |
|---|---|---|---|
| 5,915,178 A | 6/1999 | Chiang et al. | 438/266 |
| 5,970,354 A * | 10/1999 | Hause et al. | 438/305 |
| 6,228,695 B1 | 5/2001 | Hsieh et al. | 438/201 |
| 6,312,989 B1 | 11/2001 | Hsieh et al. | 438/257 |
| 6,380,583 B1 | 4/2002 | Hsieh et al. | 257/314 |
| 6,583,008 B2 * | 6/2003 | Lee et al. | 438/257 |
| 6,627,524 B2 * | 9/2003 | Scott | 438/588 |
| 6,653,188 B1 * | 11/2003 | Huang et al. | 438/257 |

* cited by examiner

*Primary Examiner*—Richard A. Booth
(74) *Attorney, Agent, or Firm*—Thomas, Kayden, Horstemeyer & Risley

(57) ABSTRACT

A new method to form MOS gates in an integrated circuit device is achieved. The method is particularly useful for forming floating gates in split gate flash transistors. The method comprises providing a substrate. A dielectric layer is formed overlying the substrate. A conductor layer is formed overlying the dielectric layer. A first masking layer is deposited overlying the conductor layer. The first masking layer is patterned to selectively expose the conductor layer. A second masking layer is deposited overlying the first masking layer and the conductor layer. The second masking layer is etched back to form spacers on sidewalls of the first masking layer. The conductor layer is etched through where exposed by the first masking layer and the spacers to thereby form MOS gates in the manufacture of the integrated circuit device.

13 Claims, 8 Drawing Sheets

6,881,629 B2

METHOD TO MAKE MINIMAL SPACING BETWEEN FLOATING GATES IN SPLIT GATE FLASH

BACKGROUND OF THE INVENTION (1) Field of the Invention

The invention relates to semiconductor memory devices, and, more particularly, to a method of forming a split gate flash memory with minimal floating gate-to-floating gate spacing.

(2) Description of the Prior Art

A split gate flash memory device is essentially a MOS transistor with a variable threshold voltage. The threshold voltage varies with the amount of charge that is stored on a floating gate structure. The floating gate structure overlies a first part of the device channel region. A control gate structure overlies a second part of the device channel region. Voltage on the control gate controls the second part of the device channel region directly and controls the first part of the device channel indirectly, as modulated by charge on the floating gate. The control gate is formed in close proximity to the floating gate so that a capacitive coupling between the control gate and the floating gate is achieved.

Flash memories have undergone significant improvements over the years. In particular, device size has been dramatically reduced. Further reductions in the device size require technological innovations. In particular, the spacing between the floating gates of adjacent split gate flash cells is a significant problem. Currently, the floating gates are patterned, or defined, using a lithographic system. For example, after the deposition of a floating gate layer, the semiconductor wafer is then coated with a photoresist layer. The photoresist layer is exposed to actinic light through a mask. After development, a pattern of photoresist is left on the wafer overlying the floating gate layer. The floating gate layer is then etched where exposed by the patterned photoresist layer.

There are several difficulties in minimizing the cell-to-cell spacing of the split gate flash cells. The floating gate spacing is often the limiting factor in the cell-to-cell spacing. If the floating gate spacing is made too small, then misalignment in the lithography process or variation in the etching process may lead to bridging or shorting of the floating gates. Alternatively, increasing the floating gate spacing will cause the floating gate overlap of active area (OD) to decrease. Misalignment or overetching could then cause the active area to be uncovered by the floating gate edge. This would result in leaky devices. Finally, methods to self-align the floating gate to the active area result in overly complicated processes or in residue issues. A primary goal of the present invention is to provide a method to reduce cell-to-cell spacing without reducing reliability or yield and without significant complexity.

Several prior art inventions relate to flash memory cells. U.S. Pat. No. 6,228,695 B1 to Hsieh et al teaches a method to form split gate flash cells with self-aligned sources and self-aligned floating gates. Spacer floating gates are formed on the sidewalls of the control gates. U.S. Pat. No. 5,915,178 to Chiang et al describes a split gate flash and a method of formation. An oxide layer is grown on the surface of the floating gate layer prior to etching the floating gate. U.S. Pat. No. 6,312,989 B1 to Hsieh et al shows a split gate flash device and a method of manufacture. U.S. Pat. No. 6,380,583 B1 to Hsieh et al teaches a split gate flash device and a method of formation. An oxide layer is grown over a floating gate layer to form a hard mask.

SUMMARY OF THE INVENTION

A principal object of the present invention is to provide an effective and very manufacturable method to form a split gate flash memory.

A further object of the present invention is to provide a method to form closely-spaced MOS gates.

A yet further object of the present invention is to provide a method to form closely-spaced floating gates.

A yet further object of the present invention is to provide a method to form closely-spaced floating gates with minimal process complexity.

A yet further object of the present invention is to provide a method to form closely-spaced split gate flash cells.

Another further object of the present invention is to provide a unique MOS gate structure.

In accordance with the objects of this invention, a method to form MOS gates in an integrated circuit device is achieved. The method comprises providing a substrate. A dielectric layer is formed overlying the substrate. A conductor layer is formed overlying the dielectric layer. A first masking layer is deposited overlying the conductor layer. The first masking layer is patterned to selectively expose the conductor layer. A second masking layer is deposited overlying the first masking layer and the conductor layer. The second masking layer is etched back to form spacers on sidewalls of the first masking layer. The conductor layer is etched through where exposed by the first masking layer and the spacers to thereby form MOS gates in the manufacture of the integrated circuit device.

Also in accordance with the objects of this invention, an integrated circuit device is achieved. The device comprises a dielectric layer overlying a substrate. A patterned conductor layer overlies the dielectric layer. A patterned first masking layer overlies the conductor layer. Spacers are on the sidewalls of the patterned first masking layer and overlie the patterned conductor layer. The external edges of the patterned conductor layer and the spacers are aligned.

BRIEF DESCRIPTION OF THE DRAWINGS

In the accompanying drawings forming a material part of this description, there is shown.

DESCRIPTION OF THE PREFERRED EMBODIMENTS

The preferred embodiments of the present invention disclose a method to form split gate flash memory. A method to form closely-spaced floating gates is described. A unique MOS gate device is illustrated. It should be clear to those experienced in the art that the present invention can be applied and extended without deviating from the scope of the present invention.

Figure 1:
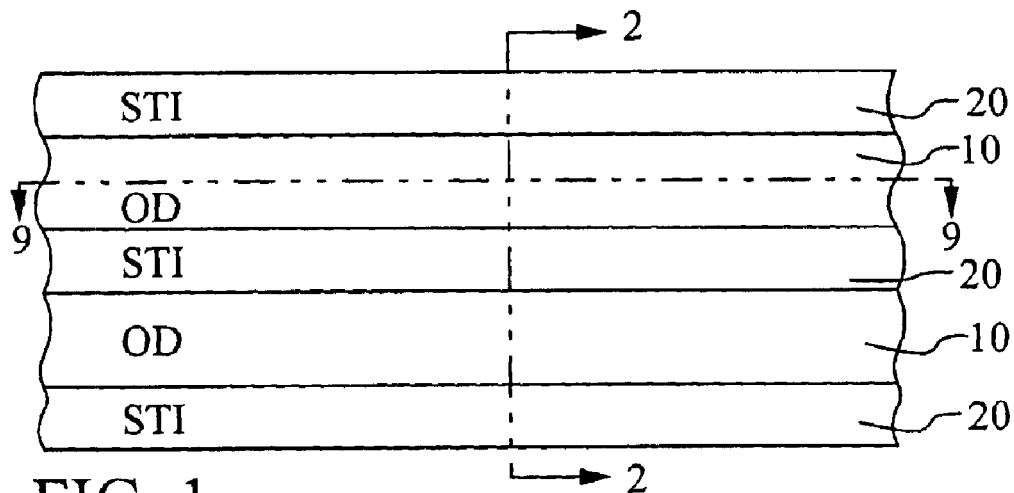
FIG. 1 illustrates a top layout view of a partially completed split gate flash device array showing a preferred embodiment of the present invention.

Referring now to FIG. 1, the preferred embodiment of the present invention is illustrated. Several important features of the present invention are shown and discussed below. A top view of a partially completed split gate flash memory of the present invention is shown. A typical flash memory comprises a very large number, perhaps millions, of identical memory cells. The cells are arranged in a two-dimensional array to facilitate addressing, reading, and writing to specific cells in the array.

In this exemplary layout, a wafer substrate 10 is provided. The substrate may comprise any suitable semiconductor material or combination of materials. Preferably, the substrate 10 comprises monocrystalline silicon. Other substrates, such as silicon on isolation (SOI), could be used. The substrate 10 is divided into two types of areas: active 10 and isolation 20. The active areas (OD) 10 are simply areas of semiconductor. The isolation areas (STI) 20 are areas where a dielectric material has been formed. The isolation areas 20 may comprise any type of dielectric material and structure suitable for isolating adjacent active devices. Preferably, the isolation areas 20 comprise shallow trench isolation (STI) that may be formed by well-known methods. Typically, STI regions 20 comprise trenches in the substrate 10 that are filled with a dielectric material such as silicon oxide. The memory array is laid out such that the STI regions 20 and active (OD) regions 10 are in parallel. Two cross sections "2" and "9" are analyzed in the description below. The "2" cross section bisects the parallel STI 20 and OD 10 regions and will illustrate the floating gate-to-floating gate spacing. The "2" cross section corresponds to FIGS. 2–8 below. The "9" cross section is parallel to the STI 20 and OD 10 regions and will illustrate adjacent split gate flash cells within an active region 10. The "9" cross section corresponds to FIGS. 9–17 below.

Figure 2:
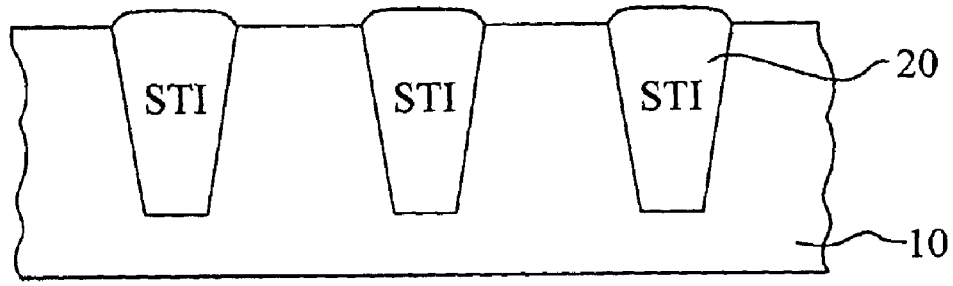
FIGS. 2–8 illustrate a first cross sectional view of the split gate flash device array showing a preferred embodiment of the present invention.
Figure 3:
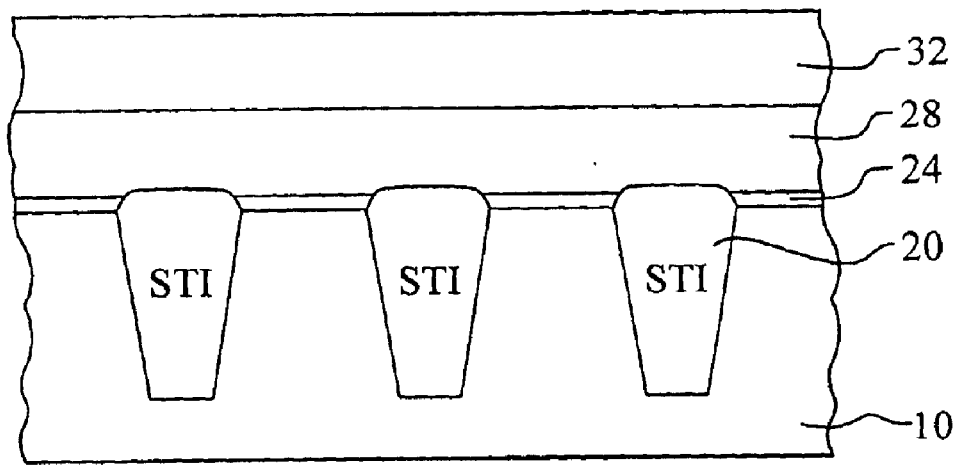

Referring now to FIG. 2, the "2" cross section is illustrated. The substrate 10 is divided by a series of isolation regions 20. Each isolation regions separates an active cell area in the substrate. Referring now to FIG. 3, several layers are formed overlying the substrate 10 and isolation regions 20. A first dielectric layer 24 is formed overlying the substrate 10 and isolation regions 20. This first dielectric layer 24 is the floating gate dielectric. The first dielectric layer 24 may comprise any dielectric layer having suitable dielectric constant and breakdown capability. Preferably, the first dielectric layer 24 comprises an oxide material. More preferably, the first dielectric layer 24 comprises silicon oxide that is thermally grown on the substrate 10 to a thickness of between about 80 Angstroms and about 110 Angstroms. For simplicity of illustration, the first dielectric layer 24 is only shown overlying the substrate 10.

A first conductor layer 28 is then grown overlying the first dielectric layer 24. The first conductor layer 28 may comprise any conductive material, such as a metal, a semiconductor, or a combination of both, that can be used in the formation of a MOS gate. Preferably, the first conductor layer 28 comprises a polysilicon layer that is deposited overlying the first dielectric layer 24. The polysilicon layer 28 may be doped or undoped. More preferably, the polysilicon layer 28 is formed by chemical vapor deposition of polysilicon to a thickness of between about 500 Angstroms and about 1,200 Angstroms.

A first masking layer 32 is then deposited overlying the first conductor layer 28. The first masking layer 32 is a key feature of the present invention. The first masking layer 32 preferably comprises a material that can be selectively etched with respect to the first conductor layer 28. More preferably, the first masking layer 32 comprises silicon nitride that is deposited by a chemical vapor deposition process. Most preferably, the first masking layer 32 is deposited to a thickness of between about 500 Angstroms and about 1,000 Angstroms.

Figure 4:
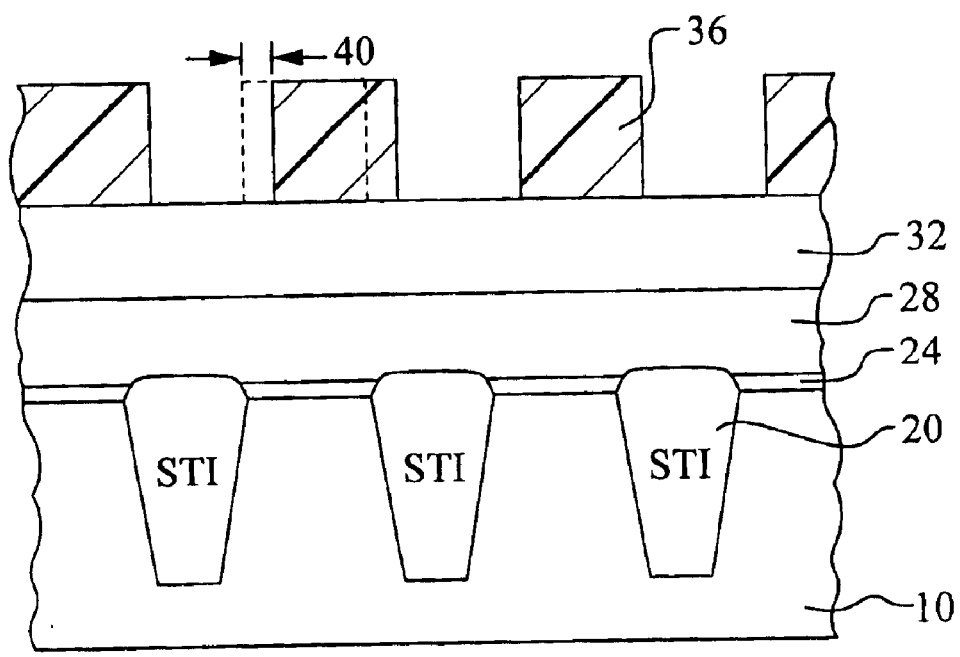
Figure 5:
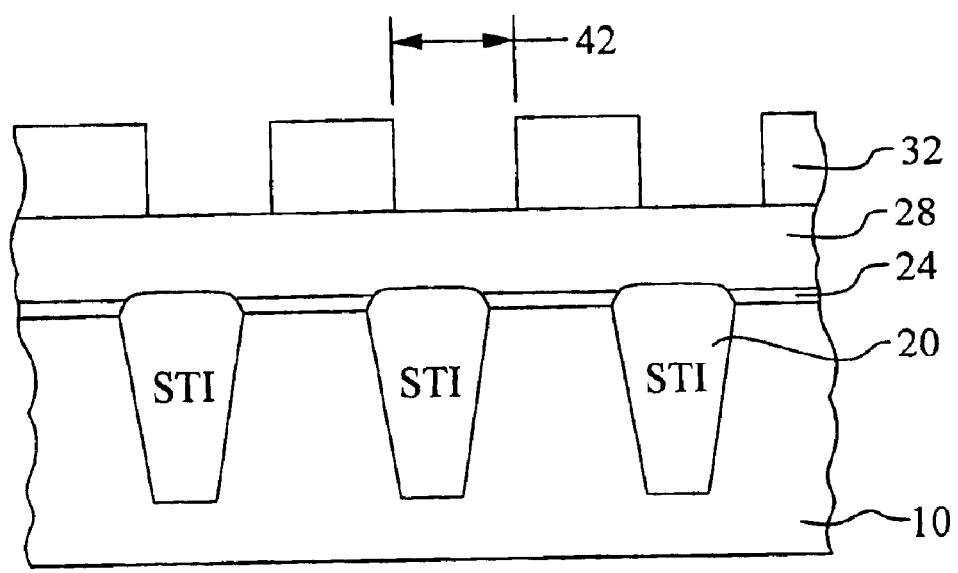

Referring now to FIG. 4, the first masking layer 32 is patterned. Preferably, the first masking layer 32 is patterned using a lithographic process as shown. A first photoresist layer 36 is deposited overlying the first-masking layer 32. The first photoresist layer 36 is exposed to actinic light through a mask and then is developed. The patterned first photoresist layer 36 covers the first masking layer 32 as shown. It is important to note that the resulting patterned first photoresist layer 36 may exhibit misalignment 40 as is well-known in the art. Referring now to FIG. 5, the first photoresist layer 36 pattern is transferred to the first masking layer 32 by etching through the first masking layer 32 where exposed by the first photoresist layer 36. The resulting, patterned first masking layer 32 is shown. Note that spacings 42 between first masking layer 32 features be made relatively large compared to the final floating gate-to-floating gate spacings that are formed using the unique method as will be demonstrated below.

Figure 6:
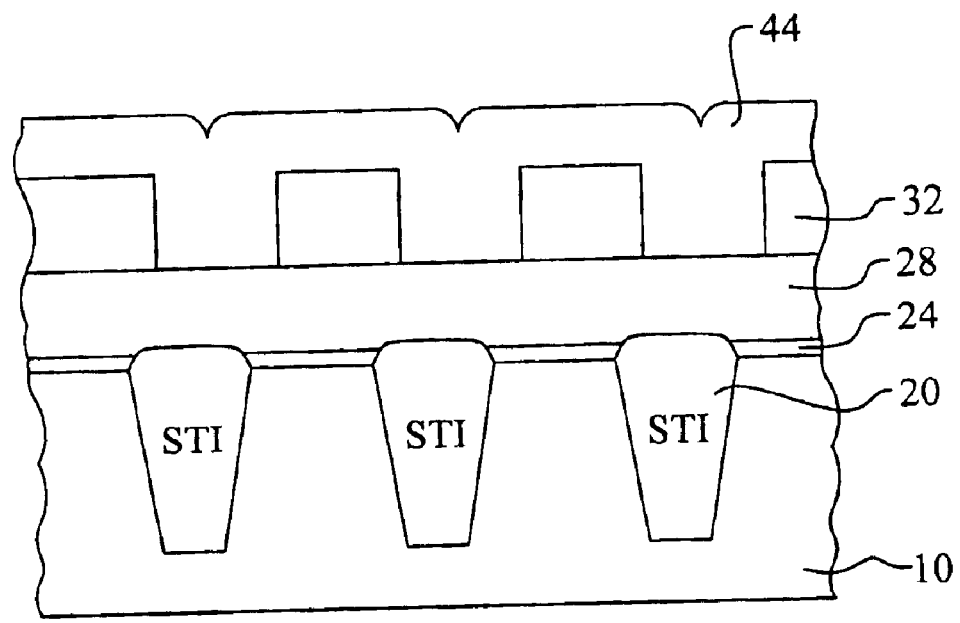

Referring now to FIG. 6, as an important feature of the present invention, a second masking layer 44 is deposited overlying the first masking layer 32 and the first conductor layer 28. The second masking layer 44 preferably comprises another material that can be selectively etched with respect to the first conductor layer 28. More preferably, the second masking layer 44 comprises silicon nitride that is deposited by chemical vapor deposition. Most preferably, the second masking layer 44 is deposited to a thickness of between about 600 Angstroms and about 1,200 Angstroms.

Figure 7:
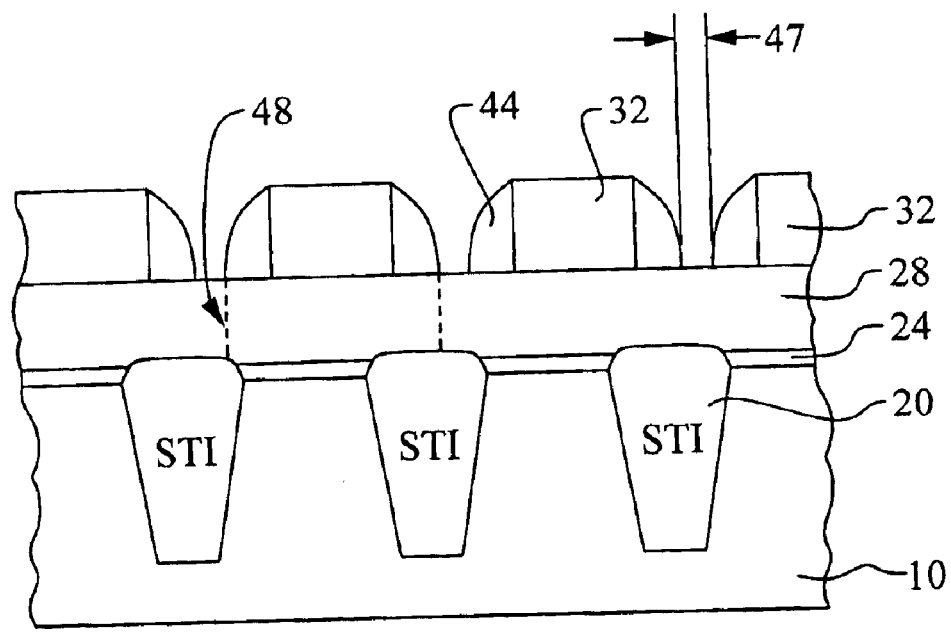

Referring now to FIG. 7, another important feature of the present invention is illustrated. The second masking layer 44 is etched back to form spacers 44 on the sidewalls of the first masking layer 32. This etch back step preferably comprises a dry etch having an anisotropic etching characteristic. The spacers 44 create a combined first and second masking-layer pattern 32 and 44 having substantially wider features and, therefore, substantially narrower spaces 47. As a result, a combined masking pattern 32 and 44 is created that has a substantially narrower space 47 than could be reliably achieved by a lithography-only process. The spaces 47 are controlled by the thickness of the deposited second masking layer 44 and by the etching back process. It is also important to note that the external edges 48 of the spacers 44 are designed to overlap the edges of the isolation regions 20 such that the resulting gates do not exhibit leakage.

Figure 8:
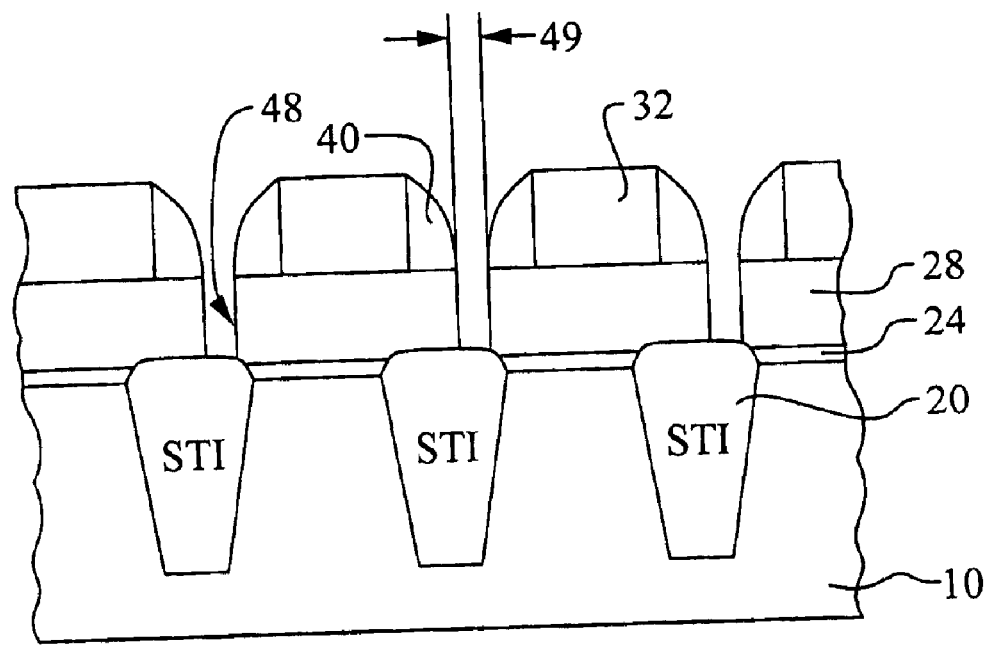

Referring now to FIG. 8, another important feature in the present invention is illustrated. The first conductor layer 28 is etched through where exposed by the first masking layer 32 and the spacers 44. The floating gates 28 of the split gate flash device are thereby formed in the direction perpendicular to the active regions 10 as shown in FIG. 1. Referring again to FIG. 8, the edges 48 of the floating gates 28 overlie the isolation regions 20. Very narrow floating gate-to-floating gate spaces 49 are possible with a minimally complex process and without creating shorting or leakage problems.

While the method of the present invention is optimally suited for the formation of split gate flash transistors, it can be used to pattern any MOS transistor gate 28. The resulting MOS gates 28 each comprise the first conductor layer 28 overlying the substrate 10 with the first dielectric layer 24 therebetween. The masking layer 32 and 44 is formed by a combination of a first masking layer 32 overlying the first conductor layer 28 and spacers 44 overlying the first conductor layer 28. The external edges of the spacers 44 and the first conductor layer 28 are aligned.

Figure 9:
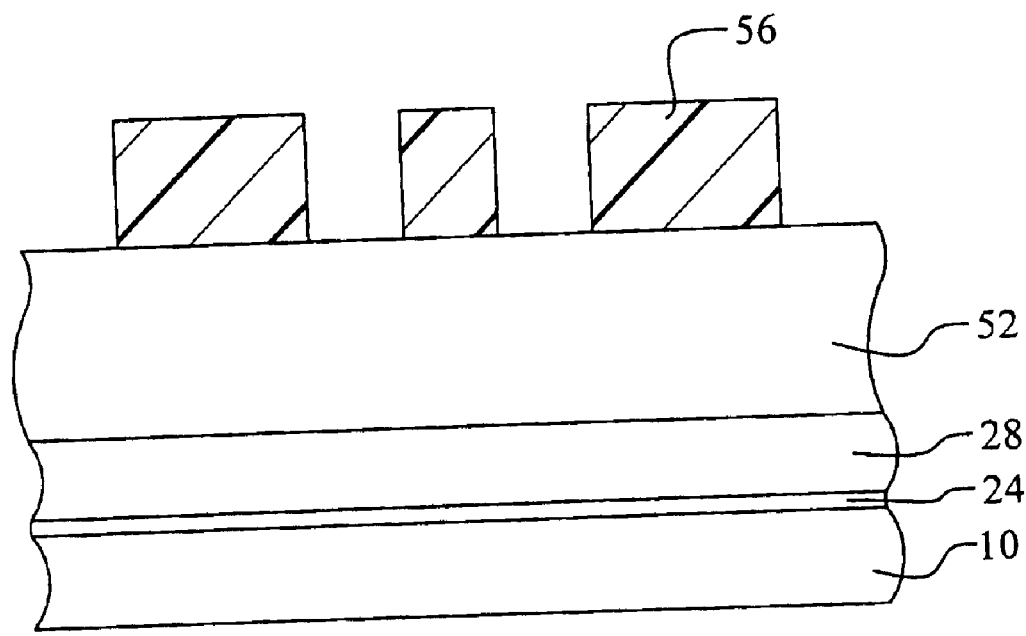
FIGS. 9–17 illustrate a second cross sectional view of the split gate flash device array showing a preferred embodiment of the present invention.

Referring now-to-FIG. 9, further processing in the formation of a split gate flash memory is illustrated using the "9" cross section. The first masking layer 32 and the spacers 44 are completely removed from the wafer surface. Note that the first conductor layer 28 has not been defined in this direction of the array. Several steps are herein illustrated in FIGS. 9–17 to define the floating-gates 28 in the active area direction, to define control gates, and to complete the memory device. Referring again to FIG. 9, a third masking layer 52 is deposited overlying the first conductor layer 28. The third masking layer 52 again preferably comprises a material, such as silicon nitride, that can be selectively etched with respect to the first conductor layer 28 and, in addition, to silicon oxide layers used as dielectrics in the exemplary device. More preferably, the third masking layer 52 is deposited to a thickness of between about 3000 Angstroms and about 4,500 Angstroms. The thickness of the third masking layer 52 largely determines the height of the final device as will be seen below. The third masking layer 52 is then patterned, preferably using lithography. A second photoresist layer 56 is deposited and patterned as shown.

Figure 10:
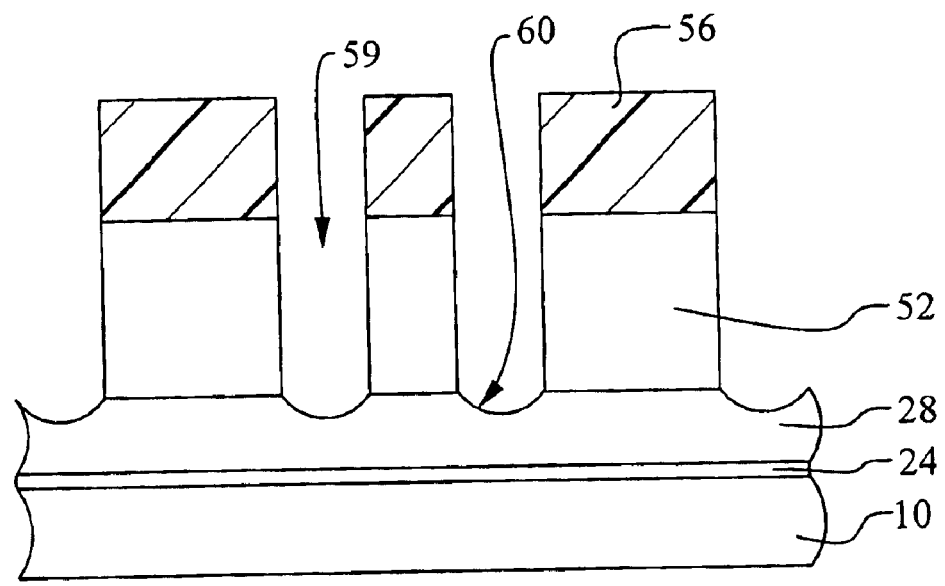

Referring now to FIG. 10, the third masking layer 52 is etched through to create openings 59. Note that an additional etch may be performed to create an optimal topography on the first conductor layer 28 as shown. In particular, by overetching into the first conductor layer 28, sharp corners 60 can be created at the edges of the third masking layer 52. These corners 60 or slopes improve the performance of the resulting floating gates.

Figure 11:
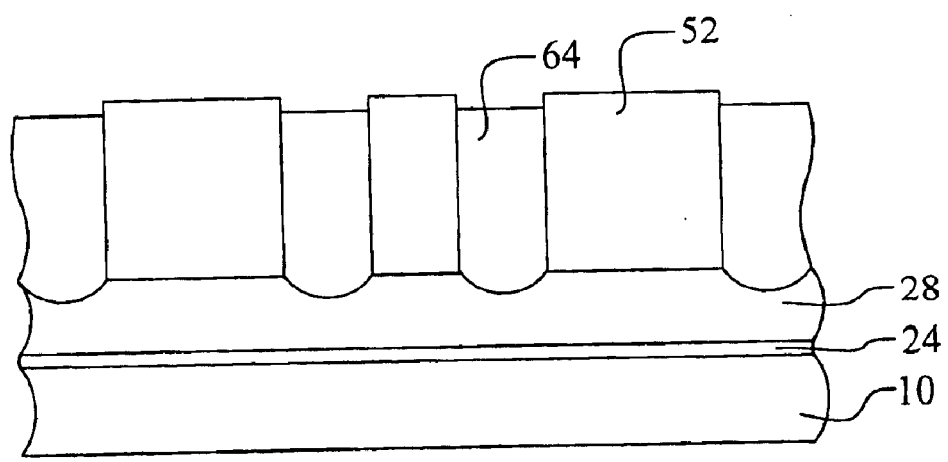

Referring now to FIG. 11, the openings 59 are filled with a dielectric material 64. Preferably, an oxide layer 64, such as silicon oxide 64, is deposited overlying the third masking layer 52 and filling the openings 59. This oxide layer 64 is then planarized using, for example, a chemical mechanical polish operation. Other planarization processes could be used.

Figure 12:
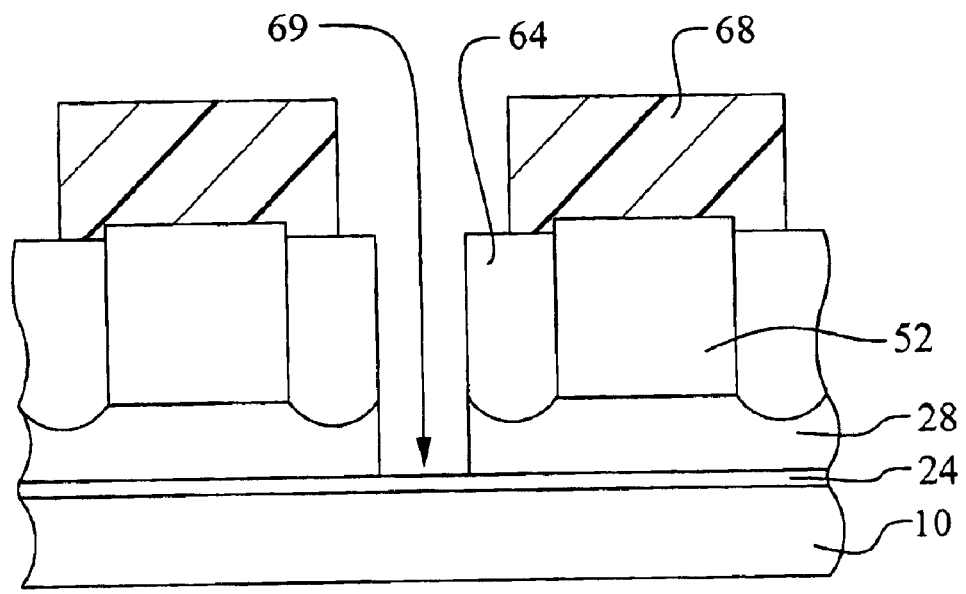

Referring now to FIG. 12, as an important feature, the floating gates are defined in the active region direction. First, another lithographic mask 68 is defined overlying the third masking layer 52 and the oxide layer 64. Next, the third masking layer 52 is selectively etched where exposed by the lithographic mask 68. Finally, the first conductor layer 28 is etched through where exposed by a lithographic mask 68 and by the oxide layer 64. Note that this step defines the floating gates 28 in the active area direction. In addition, the edges of the floating gates 28 so defined are self-aligned to the previously formed-oxide layer 64. Finally, the opening 68 that is formed serves as the source opening 68 for the completed device. Ions may be implanted through this opening to forms source regions; not shown.

Figure 13:
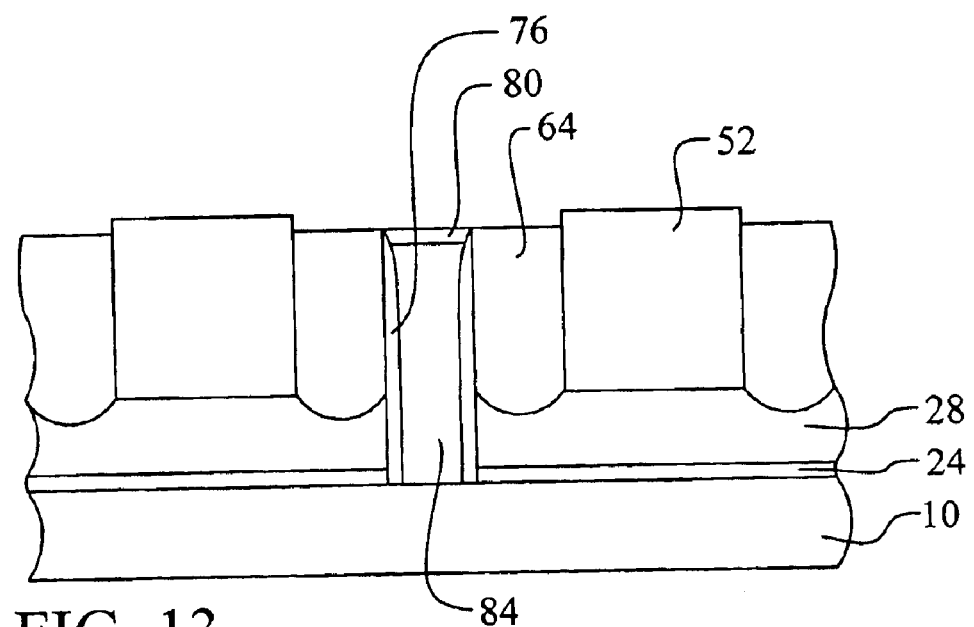

Referring now to FIG. 13, the source openings 68 are now lined with a lining oxide layer 76. Preferably, the lining oxide layer 76 is formed by first depositing silicon oxide to a thickness of between about 300 Angstroms and about 500 Angstroms and then etching back this silicon oxide to form spacers 76 lining the opening 68. Next, a conductive plug layer 84 is deposited to fill the openings 68. Preferably, the conductive plug layer 84 comprises polysilicon. The conductive plug layer 84 is then planarized using, for example, a chemical mechanical polish, to complete the source plug 84. Finally, a capping oxide layer 80 is formed overlying the conductive plug layer 84 by, for example, a thermal oxidation step.

Figure 14:
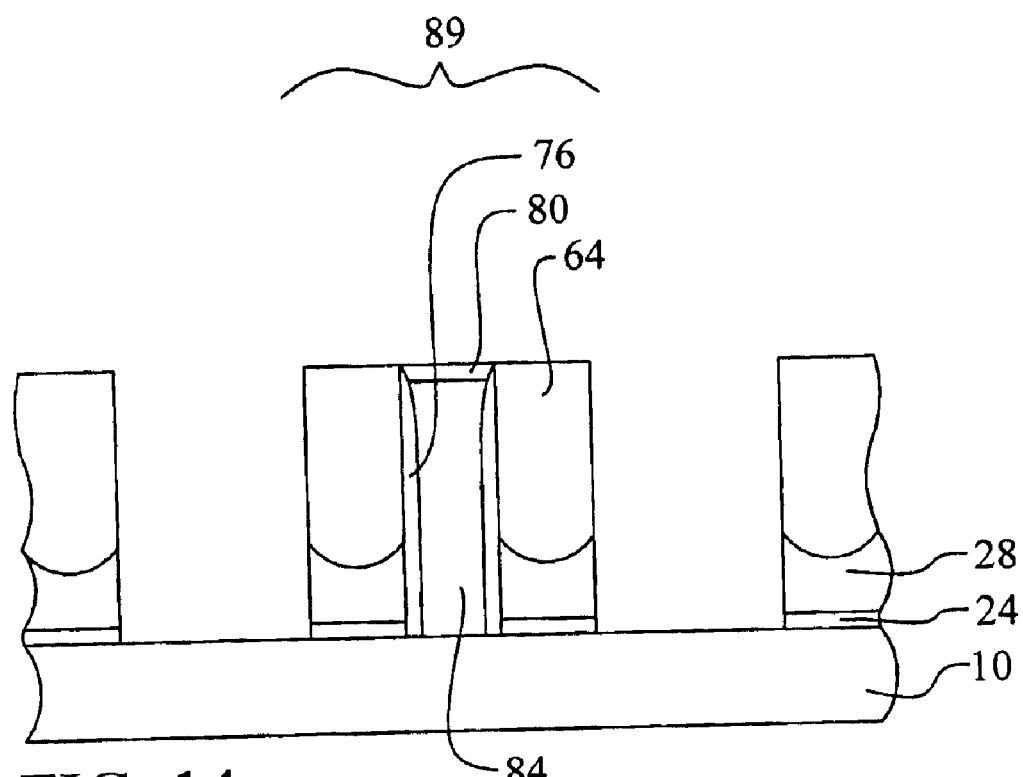

Referring now to FIG. 14, the remaining third masking layer 52 is now removed by etching. In addition, the first dielectric layer 24 is removed from the surface of the substrate 10. As a result of the processing to this point, pairs 89 of floating gates 28 are formed with source plugs 84 therebetween.

Figure 15:
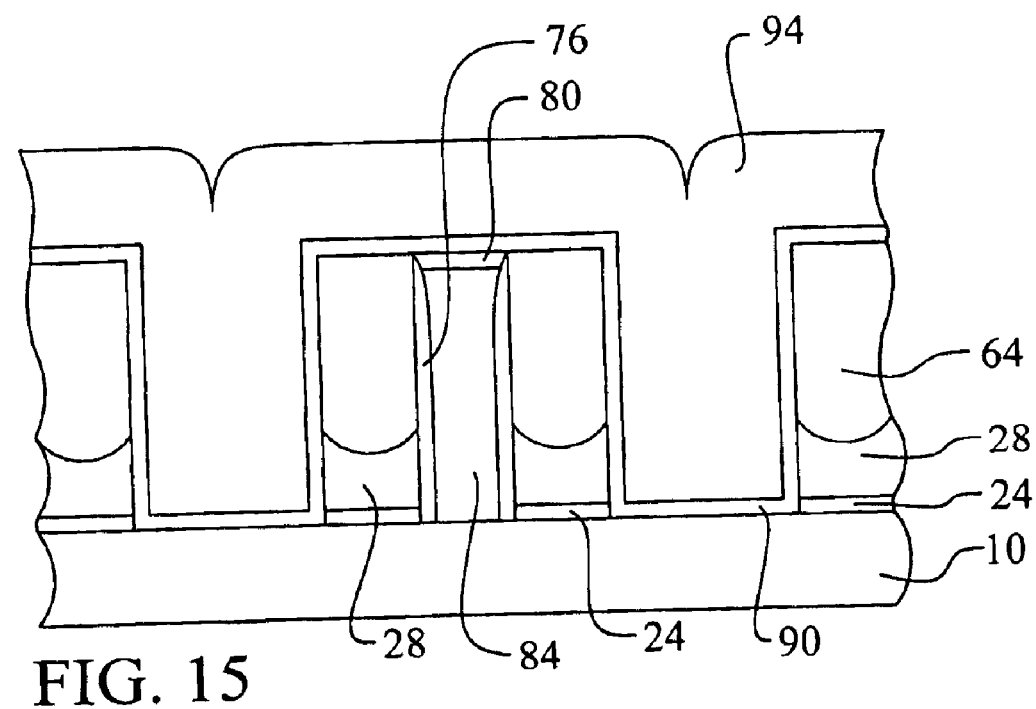

Referring now to FIG. 15, a second dielectric layer 90 is formed overlying the floating gate pair 891 and the substrate 10. The second dielectric layer 90 preferably comprises a silicon oxide layer that is formed by thermal oxidation to a thickness of between about 120 Angstroms and about 180 Angstroms. A second conductor layer 94 is then deposited overlying the second dielectric layer 0.90. The second conductor layer 94 will be used to form the control gates for the split gate flash devices. The second-conductor layer 94 preferably comprises polysilicon that is doped or undoped. More preferably, the second conductor layer 94 is deposited to a thickness of between about 1,500 Angstroms and about 3,000 Angstroms.

Figure 16:
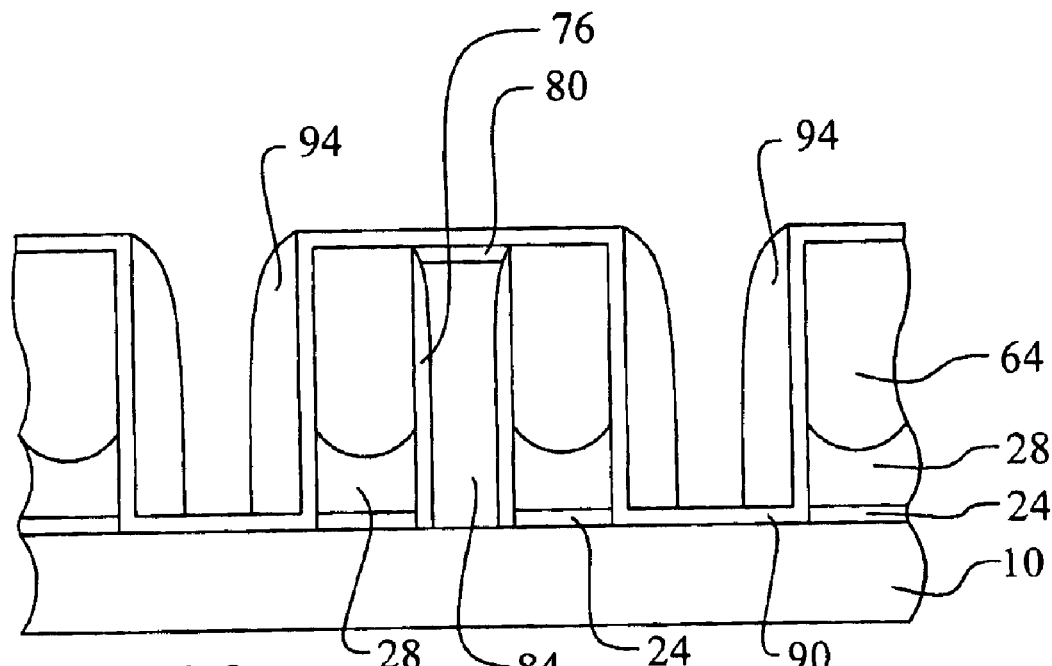

Referring now to FIG. 16, as a key feature, the second conductor layer 94 is etched back to form spacers 94 on the sidewalls of the floating gates 28, with the second dielectric layer 90 therebetween. The etching-back step is preferably performed using-a dry etch with an anisotropic characteristic. The resulting spacers 94 form the control gates and word lines for each side of the floating gate pairs 89.

Figure 17:
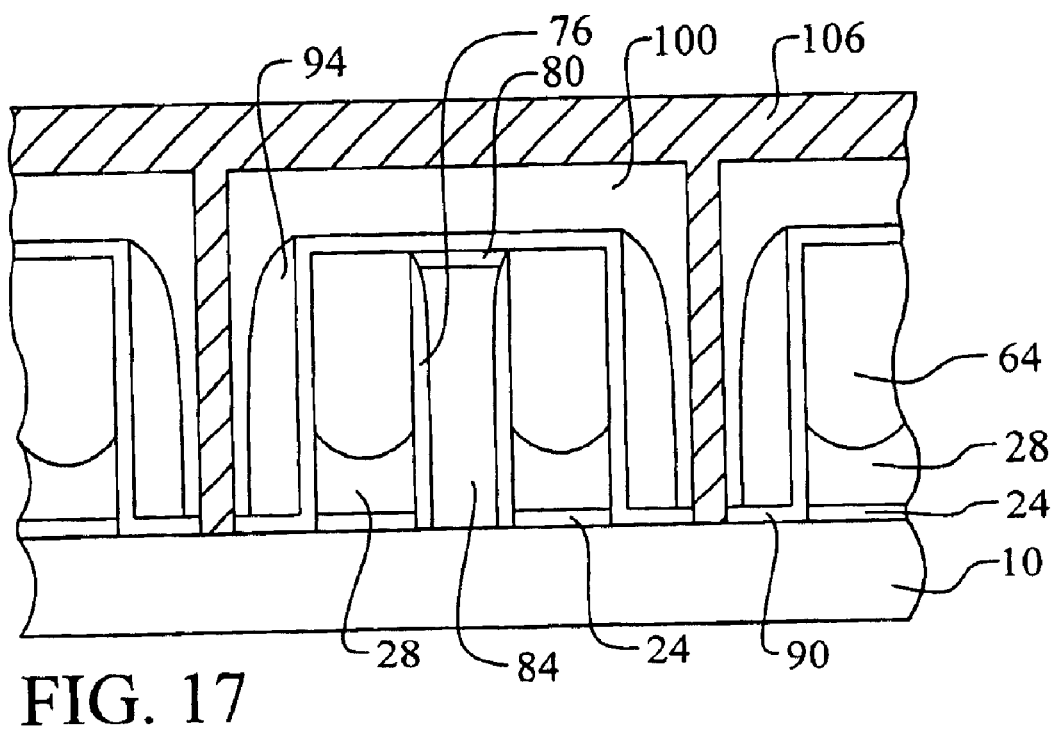

Finally, referring now to FIG. 17, the split gate flash memory device is completed. Drain regions, not shown, may be formed by ion implantation between the control gates 94. An isolation layer 100 is deposited overlying the wafer. Contact openings are made in the isolation layer 100. A metal layer 106 is deposited and patterned to form connective lines in the array.

The advantages of the present invention may now be summarized. An effective and very manufacturable method to form a split gate flash memory is achieved. The method is used to form closely-spaced MOS gates and, more particularly, closely-spaced floating gates. The method to form closely-spaced floating gates adds minimal process complexity to the base process. The floating gates so formed are incorporated into split gate flash devices. A unique MOS gate structure is achieved.

As shown in the preferred embodiments, the novel method and device of the present invention provides an effective and manufacturable alternative to the prior art.

While the invention has been particularly shown and described with reference to the preferred embodiments thereof, it will be understood by those skilled in the art that various changes in form and details may be made without departing from the spirit and scope of the invention.

What is claimed is:

1. A method to form MOS gates in an integrated circuit device comprising:

providing a substrate;

forming a dielectric layer overlying said substrate;

forming a conductor layer overlying said dielectric layer;

depositing a first masking layer overlying said conductor layer;

patterning said first masking layer to selectively expose said conductor layer;

depositing a second masking layer overlying said first masking layer and said conductor layer;

etching back said second masking layer to form spacers on sidewalls of said first masking layer;

etching through said conductor layer where exposed by said first masking layer and said spacers to thereby form MOS gates in the manufacture of said integrated circuit device;

removing said first masking layer and said spacers;

etching said MOS gates to selectively expose said substrate;

forming a second dielectric layer overlying said MOS gates and said substrate;

deposing a second conductor layer overlying said second dielectric layer; and etching back said second conductor layer to form second MOS gates on sidewalls of said MOS gates.

2. The method according to claim 1 wherein said MOS gates comprise floating gates for split gate flash devices.

3. The method according to claim 1 wherein said dielectric layer comprises oxide.

4. The method according to claim 1 wherein said conductor layer comprises polysilicon.

5. The method according to claim 1 wherein said first masking layer comprises silicon nitride.

6. The method according to claim 1 wherein said second masking layer comprises silicon nitride.

7. The method according to claim 1 wherein edges of said MOS gates overlie isolation structures in said substrate.

8. The method according to claim 1 wherein said MOS gates comprise control gates for split gates flash devices.

9. A method to form MOS gates in an integrated circuit device comprising:

providing a substrate;

forming a first dielectric layer overlying said substrate;

forming a first conductor layer overlying said dielectric layer;

depositing a first masking layer overlying said first conductor layer;

patterning said first masking layer to selectively expose said first conductor layer;

depositing a second masking layer overlying said first masking layer and said first conductor layer;

etching down said second masking layer to form spacers on sidewalls of said first masking layer;

etching through said first conductor layer where exposed by said first masking layer and said spacers to thereby form floating gates;

removing said first masking layer and said spacers;

etching said floating gates to selectively expose said substrate;

forming a second dielectric layer overlying said floating gates and said substrate;

deposing a second conductor layer overlying said second dielectric layer; and etching back said second conductor layer to form control gates on sidewalls of said MOS gates in the formation of said split gate flash devises in the manufacture of said integrated circuit device.

10. The method according to claim 9 wherein said first and second dielectric layer comprise oxide.

11. The method according to claim 9 wherein said first and second conductor layer comprise polysilicon.

12. The method according to claim 9 wherein said first masking layer comprises silicon nitride.

13. The method according to claim 9 wherein edges of said floating gates overlie isolation structures in said substrate.

* * * * *